United States Patent
Chuang (10) Patent No.: US 9,154,080 B2
(45) Date of Patent: Oct. 6, 2015

(54) MIXER WITH CALIBRATION CIRCUIT AND CALIBRATION METHOD THEREOF

(71) Applicant: AIROHA TECHNOLOGY CORP., Hsinchu (TW)

(72) Inventor: Chao Hsi Chuang, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 88 days.

(21) Appl. No.: 14/024,989

(22) Filed: Sep. 12, 2013

(65) Prior Publication Data

US 2014/0087669 A1 Mar. 27, 2014

Related U.S. Application Data (60) Provisional application No. 61/705,189, filed on Sep. 25, 2012.

(51) Int. Cl.
*H03D 7/14* (2006.01)
*H04B 1/40* (2015.01)
*H04B 17/21* (2015.01)

(52) U.S. Cl.
CPC ............ *H03D 7/1491* (2013.01); *H03D 7/145* (2013.01); *H03D 7/1441* (2013.01); *H04B 1/40* (2013.01); *H04B 17/21* (2015.01)

(58) Field of Classification Search
CPC ..... H03D 7/1466; H03D 7/1491; H04B 1/40; H04W 52/0283
See application file for complete search history.

(56) References Cited

U.S. PATENT DOCUMENTS

| | | | |
|---|---|---|---|
| 6,535,725 B2 | 3/2003 | Hatcher et al. | |
| 7,012,457 B2 | 3/2006 | Moran et al. | |
| 7,521,981 B2 | 4/2009 | Ng et al. | |
| 7,603,096 B2 | 10/2009 | Chung et al. | |
| 7,657,236 B2 | 2/2010 | Pan | |
| 2008/0039031 A1* | 2/2008 | Pan | 455/114.2 |
| 2008/0200135 A1* | 8/2008 | Chung | 455/130 |
| 2011/0095818 A1* | 4/2011 | Sullivan | 330/124 R |

* cited by examiner

*Primary Examiner* — Andrew Wendell
(74) *Attorney, Agent, or Firm* — Rosenberg, Klein & Lee (57) ABSTRACT

A mixer with calibration circuit includes a first gm stage unit, a second gm stage unit, a first detecting unit, a second detecting unit, a comparison block, a control unit and a compensator. The first detecting unit and the second detecting unit are respectively connected to different gm stage unit, and the comparison block compares voltage signals of the first detecting unit and the second detecting unit. The control unit adjusts a current signal of the comparison block according to the comparative result of voltage signals of the first detecting unit and the second detecting unit. Further, the compensator adjusts the first gm stage unit and the second gm stage unit according to the current signal. Thereafter, the improvement of the LO leakage of the mixer can be achieved.

17 Claims, 7 Drawing Sheets

MIXER WITH CALIBRATION CIRCUIT AND CALIBRATION METHOD THEREOF

REFERENCE TO RELATED APPLICATION

This reference is based on Provisional Application Ser. No. 61/705,189, filed 25 Sep. 2012.

BACKGROUND OF THE INVENTION

1. Technical Field

The present invention relatives to a mixer and more particularly to a mixer with calibration circuit to improve LO leakage.

2. Description of the Prior Art

Wireless communication has been widely applied in various applications. Typically, each wireless communication device requires a radio transceiver (i.e., a receiver and a transmitter). With the demand for enhanced performance, a direct conversion technology has been developed for size, cost and lower power consumption.

Figure 1:
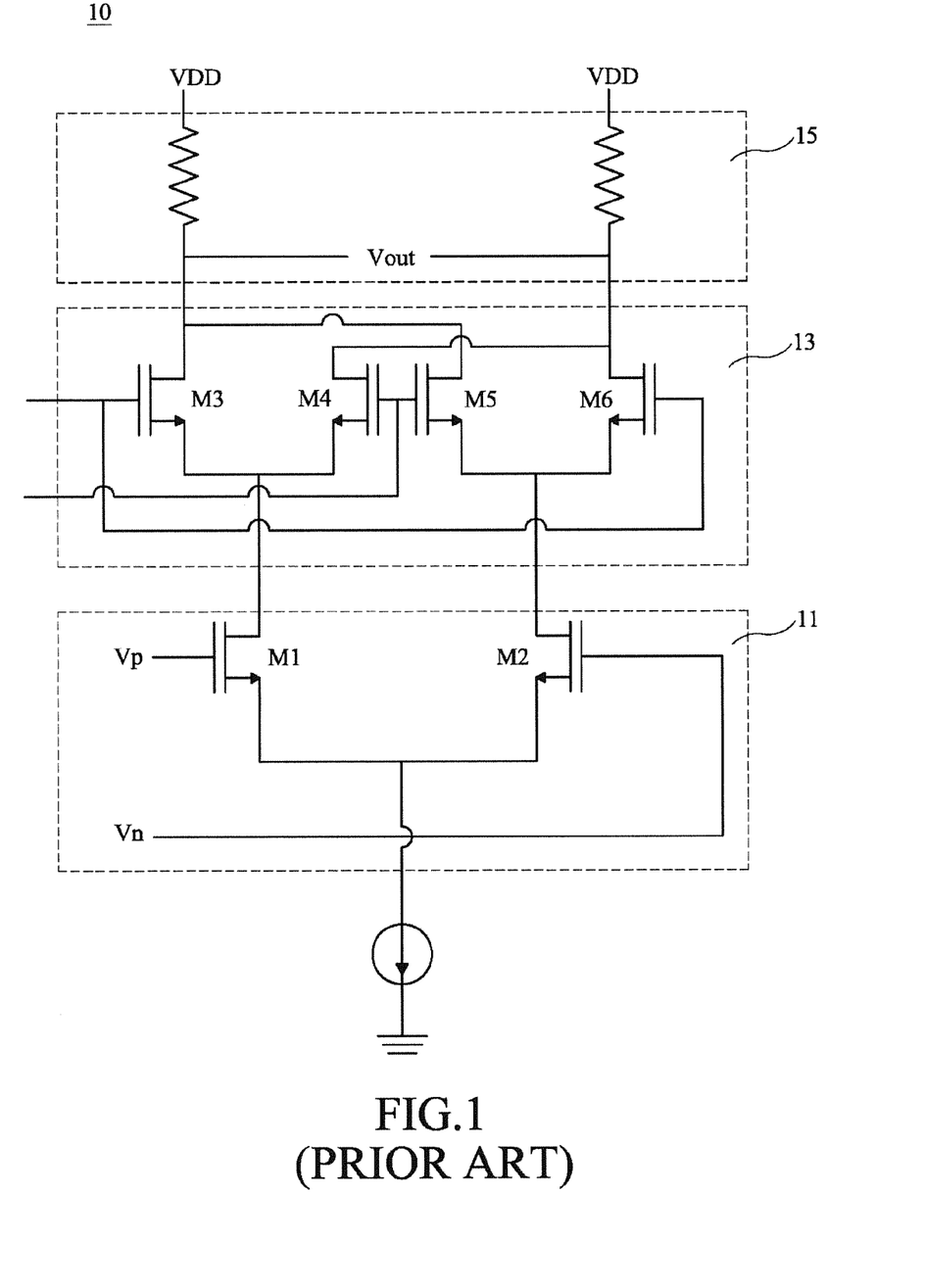
FIG. 1 is a circuit diagram of a conventional mixer.

Referring to FIG. 1, a circuit diagram of a conventional mixer is shown. As illustrated, the conventional mixer 10 comprises a gm stage block 11, a LO switch stage block 13, and an output load stage block 15. A RF input signal is amplified in the gm stage block 11, down-converted to an IF current signal in the LO switch stage block 13, and then converted to a voltage signal by the output load stage block 15.

The gin stage block 11 comprises transistors M1 and M2, and the RF input signal, such as two differential input signals Vp and Vn, are inputted transistors M1 and M2 of the input gm stage block 11. The gm stage block 11 is capable of perform a voltage, such as Vp and Vn, to current conversion, and affects the gain and linear of the mixer 10.

The LO switch stage block 13 comprises transistors M3, M4, M5 and M6 and form a multiplication function, multiplying the linear RF signal current from M1 and M2 with the LO signal applied across M3 to M6 which provide the switching function. M1 and M2 provide +/−RF current and M3 and M4 switch between them to provide the RF signal or the inverted RF signal to the left hand load. M5 and M6 switch between them for the right hand load. The output load stage block 15 comprise two load resistors R1 and R2 form a current to voltage transformation giving differential output IF signals.

SUMMARY OF THE PRESENT INVENTION

It is, therefore, the main object of the present invention to provide a mixer with calibration circuit, which comprises a gm stage block, a detector, a comparison block, a control unit and a compensator to operate the calibration of the mixer and enhance LO leakage.

It is another object of the present invention to provide a mixer with calibration circuit, which comprises a first gm stage unit, a second gm stage unit, a first detecting unit, a second detecting unit, a comparison block, a control unit and a compensator. The first detecting unit and the second detecting unit are respectively connected to different gm stage unit, and the control unit adjusts a current signal of the comparison block until a first voltage of the first gm stage unit and a second voltage of the second gm stage unit are respectively equal to a first reference voltage and a second reference voltage. Further, the compensator adjust a first bias voltage provided to the first gm stage unit and a second bias voltage provided to the second gm stage unit according to the current signal. Thereafter, the improvement of the LO leakage of the mixer can be achieved.

It is another object of the present invention to provide a mixer with calibration circuit, which comprises a control unit connected to a gm stage block via a comparison block, and the control unit is capable to adjust the current signal of the comparison block to adjust current inputted the gm stage block, and a compensator connected the gm stage block to adjust a bias voltage inputted the gm stage.

To achieve these and other objects of the present invention, the present invention provides a mixer with calibration circuit, comprising: a gm stage block comprising a first gm stage unit and a second gm stage unit; a detector comprising a first detecting unit adapted to connect to the first gm stage unit or the second gm stage unit, and a second detecting unit adapted to connect to the first gm stage unit or the second gm stage unit, wherein the first detecting unit and the second detecting unit are respectively connected to different gm stage unit; a comparison block connected to the detector and the gm stage block adapted to compare voltage signals of the first detecting unit and the second detecting unit; a control unit connected to the comparison block adapted to adjust a current signal of the comparison block according to the comparative result of voltage signals of the first detecting unit and the second detecting unit, and generate a compensation signal according to the current signal; and a compensator connected with the control unit, the first gm stage unit and the second gm stage unit adapted to adjust the first gm stage unit and the second gm stage unit according to the compensation signal.

Further, the present invention provides a calibration method of a mixer, wherein the mixer comprises a first gm stage unit, a second gm stage unit, a first detecting unit, a second detecting unit, a comparison block, a control unit and a compensator, comprising steps of: connecting the first gm stage unit and the second detecting unit; connecting the second gm stage unit and the first detecting unit; comparing voltage signals of the first detecting unit and the second detecting unit; adjusting a current signal of the comparison block according to comparative results of voltage signals of the first detecting unit and the second detecting unit; connecting the first gm stage unit and the first detecting unit; connecting the second gm stage unit and the second detecting unit; comparing voltage signals of the first detecting unit and the second detecting unit; adjusting the current signal of the comparison block according to comparative results of voltage signals of the first detecting unit and the second detecting unit; and adjusting the first gm stage unit and the second gm stage unit according to the current signal of the comparison block.

The present invention provides a mixer with calibration circuit, which further comprises a first switch unit connected with the first detecting unit, the first gm stage unit, and the second gm stage unit enabling the first gm stage unit or the second gm stage unit to connect to the first detecting unit; and a second switch unit connected with the second detecting unit, the first gm stage unit and the second gm stage unit enabling the first gm stage unit or the second gm stage unit to connect to the second detecting unit.

The present invention provides a mixer with calibration circuit, wherein the comparison block compares a first voltage between the first gm stage unit and the second detecting unit and a first reference voltage between the second gm stage unit and the first detecting unit, and compares a second voltage between the second gm stage unit and the second detecting unit and a second reference voltage between the first gm stage unit and the first detecting unit.

The present invention provides a mixer with calibration circuit, wherein the control unit adjusts the current signal of the comparison block until the first voltage is equal to the first reference voltage and the second voltage is equal to the second reference voltage.

The present invention provides a mixer with calibration circuit, wherein the compensator adjusts the value of a first bias voltage provided to the first gm stage unit and the value of a second bias voltage provided to the second gm stage unit according to the compensation signal.

The present invention provides a mixer with calibration circuit, wherein the first detecting unit and the second detecting unit are current-to-voltage conversion units.

The present invention provides a mixer with calibration circuit, wherein the first detecting unit comprises a first transistor and the second detecting unit comprises a second transistor, wherein the gate and the source of the first transistor are connected each other.

The present invention provides a mixer with calibration circuit, wherein the current signal is a first current signal as the first voltage is equal to the first reference voltage, and the current signal is a second current signal as the second voltage is equal to the second reference voltage.

The present invention provides a mixer with calibration circuit, wherein the control unit compares the first current signal and the second current signal to generate the compensation signal.

The present invention provides a mixer with calibration circuit, wherein the control unit records the first current signal and the second current signal.

The present invention provides a mixer with calibration circuit, wherein the comparison block comprises a comparator connected to the first detecting unit, the second detecting unit and the control unit, and a current controller outputted the current signal and connected to the control unit, wherein the control unit is able to adjust the current signal of the current controller.

The present invention provides a calibration method of a mixer, wherein the mixer further comprises a LO switch stage block, further comprising the step of: turning off the LO switch stage block.

The present invention provides a calibration method of a mixer, which further comprises steps of: comparing a first voltage between the first gm stage unit and the second detecting to a first reference voltage between the second gm stage unit and the first detecting unit; and comparing a second voltage between the second gm stage unit and the second detecting to a second reference voltage between the first gm stage unit and the first detecting unit.

The present invention provides a calibration method of a mixer, wherein the current signal of the comparison block is a first current signal as the first voltage is equal to the first reference voltage, and the current signal of the comparison block is a second current signal as the second voltage is equal to the second reference voltage.

The present invention provides a calibration method of a mixer, which further comprises steps of: recording the value of the first current by the control unit; and recoding the value of the second current by the control unit.

The present invention provides a calibration method of a mixer, which further comprises steps of: adjusting the value of a first bias voltage inputted the first gm stage unit and the value of a second bias voltage inputted the second gm stage unit according to the first current signal and the second current signal.

The present invention provides a calibration method of a mixer, wherein the first detecting unit and the second detecting unit are current-to-voltage conversion unit.

The present invention provides a calibration method of a mixer, which further comprises steps of: comparing the first current signal and the second current signal.

Other advantages and features of the present invention will be fully understood by reference to the following specification in conjunction with the accompanying drawings, in which like reference signs denote like components of structure.

BRIEF DESCRIPTION OF THE DRAWINGS

FIG. 3 is a circuit diagram of a mixer with calibration circuit in accordance with an embodiment of the present invention.

DETAILED DESCRIPTION OF THE PREFERRED EMBODIMENTS

Figure 2:
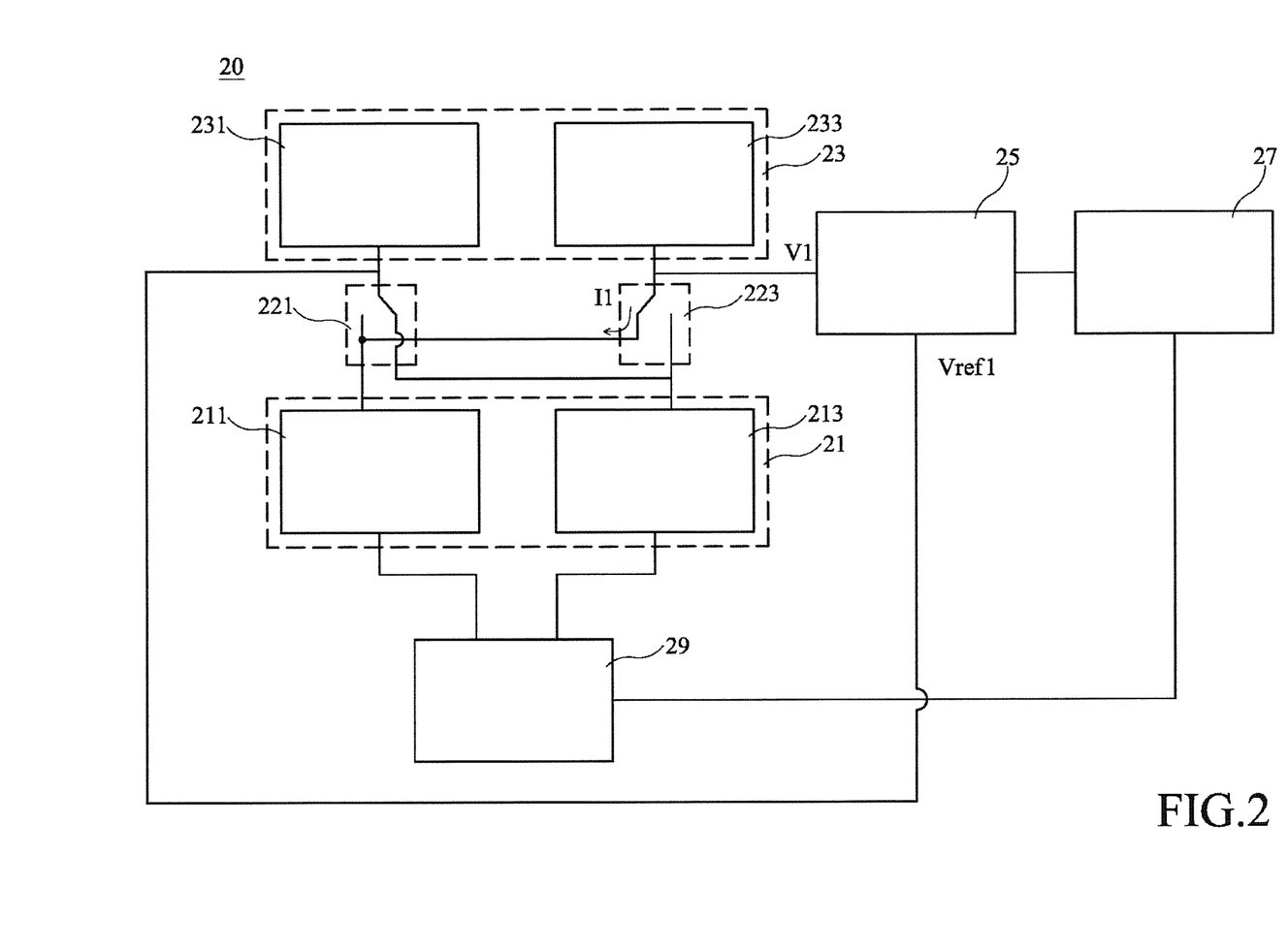
FIG. 2 is a block diagram of a mixer with calibration circuit in accordance with an embodiment of the present invention.

Please refer to FIG. 2, a block diagram of a mixer with calibration circuit in accordance with an embodiment of the present invention is shown. As illustrated, the mixer 20 comprises a gm stage block 21, a detector 23, a comparison block 25, a control unit 27, and a compensator 29, wherein the gm stage block 21 comprises a first gm stage unit 211 and a second gm stage unit 213, and the detector 23 comprises a first detecting unit 231 and a second detecting unit 233.

The first detecting unit 231 is able to connect to the first gm stage unit 211 or the second gm stage unit 213, and the second detecting unit 233 is able to connect to the first gm stage unit 211 or the second gm stage unit 213. During calibration process, the first detecting unit 231 and the second detecting unit 233 are respectively connected to different gm stage unit 211/213. For example, as the first detecting unit 231 connects to the first gm stage unit 211, the second detecting unit 233 connects to the second gm stage unit 213. As the first detecting unit 231 connects to the second gm stage unit 213, the second detecting unit 233 connects to the first gm stage unit 211.

In one embodiment, the first detecting unit 231 connects to the first gm stage unit 211 or the second gm stage unit 213 via a first switch unit 221, and then the first switch unit 221 is adapted to switch the first gm stage unit 211 or the second gm stage unit 213, enabling the first gm stage unit 211 or the second gm stage unit 213 to be electrically connected to the first detecting unit 231.

The second detecting unit 233 connects to the first gm stage unit 211 or the second gm stage unit 213 via a second switch unit 223, and then the second switch unit 223 is adapted to switch the first gm stage unit 211 or the second gm stage unit 213, enabling the first gm stage unit 211 or the second gm stage unit 213 to be electrically connected to the second detecting unit 233.

Figure 3:
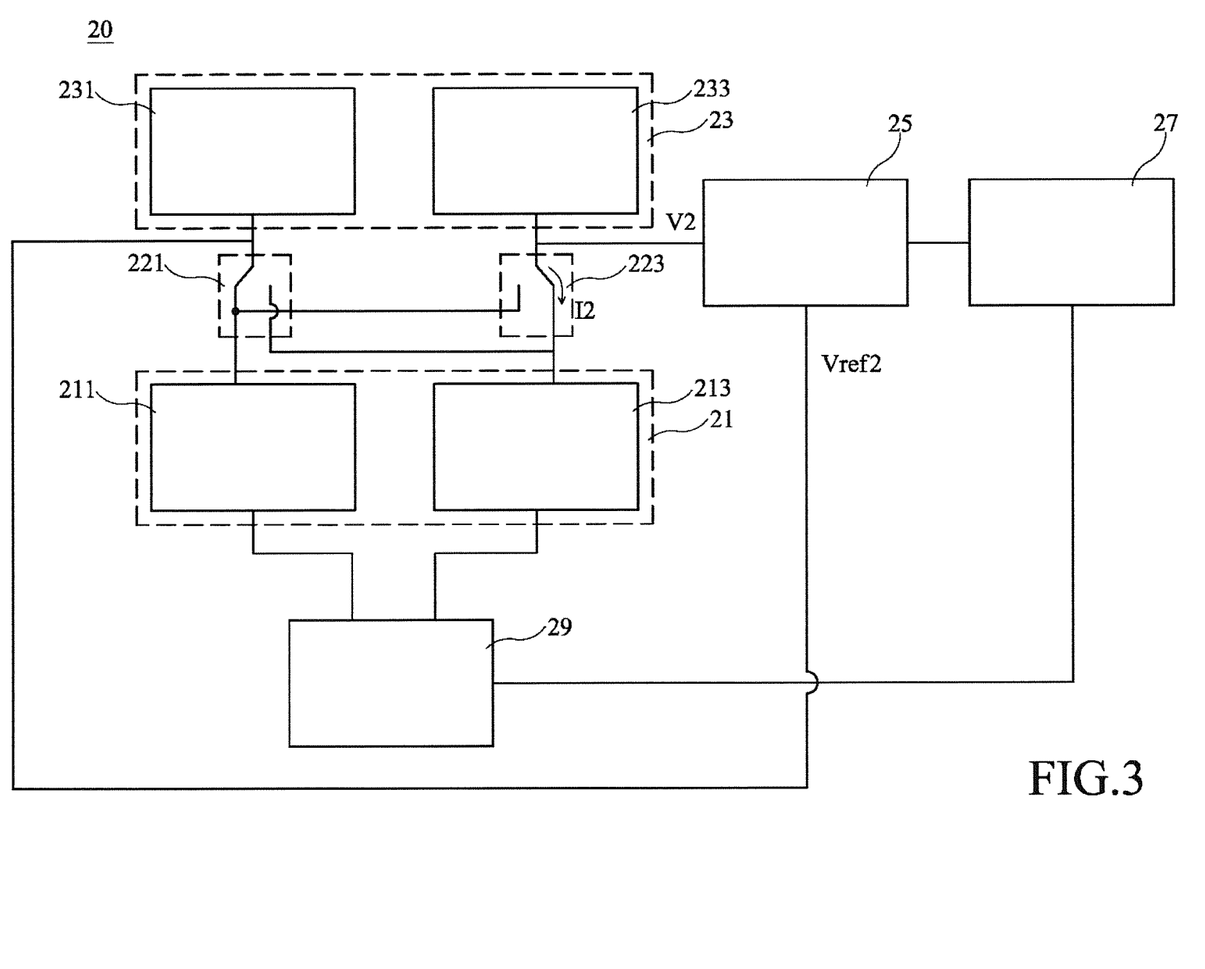
FIG. 3 is a block diagram of a mixer with calibration circuit in accordance with an embodiment of the present invention.

The comparison block 25 connects to the gm stage block 21 and the detector 23, and is capable to compare voltage signals of the first detecting unit 231 and the second detecting unit 233. In one embodiment, the comparison block 25 receives a first voltage V1 from the first gm stage unit 211 and the second detecting unit 233, and receives a first reference voltage Vref1 from the second gm stage unit 213 and the first detecting unit 231, and then the comparison block 25 compares the first voltage V1 to the first reference voltage Vref1, as shown in FIG. 2. Alternative, the comparison block 25 receives a second voltage V2 form the second gm stage unit 213 and second detecting unit 233, and receives a second reference voltage Vref2 from the first gm stage unit 211 and the first detecting unit 231, and then the comparison block 25 compares the second voltage V2 to the second reference voltage Vref2, as shown in FIG. 3.

In one embodiment, the comparison block 25 and the second detecting unit 233 connects to the first gm stage unit 211 or the second gm stage unit 213 via the second switch unit 223, and then the second switch unit 223 is adapted to switch the first gm stage unit 211 or the second gm stage unit 213, enabling the first gm stage unit 211 or the second gin stage unit 213 to be electrically connected to the comparison block 25 and the second detecting unit 233. Thus, the comparison block 25 is able to receive the first voltage V1 from the first gin stage unit 211 and the second detecting unit 233 via the second switch unit 223 or receive the second voltage V2 from the second gm stage unit 213 and the second detecting unit 233 via the second switch unit 223.

Moreover, the comparison block 25 and the first detecting unit 231 connects to the first gm stage unit 211 or the second gm stage unit 213 via the first switch unit 221, and then the first switch unit 221 is adapted to switch the first gm stage unit 211 or the second gm stage unit 213, enabling the first gin stage unit 211 or the second gm stage unit 213 to be electrically connected to the comparison block 25 and the first detecting unit 231. Thus, the comparison block 25 is able to receive the first reference voltage Vref1 from the second gm stage unit 213 and the first detecting unit 231 via the first switch unit 221 or receive the second reference voltage Vref2 from the first gin stage unit 211 and the first detecting unit 231 via the first switch unit 221.

The control unit 27 connects to the comparison block 25. The control unit 27 is capable to adjust a current signal of the comparison block 25 according to the comparative result of voltage signals of the first detecting unit 231 and the second detecting unit 233. For example, the control unit 27 adjusts a current signal of the comparison block 25 to adjust the value of the first current I1, the second current I2, the first voltage V1, and the second voltage V2 until the first voltage V1 is equal to the first reference voltage Vref1, and the second voltage V2 is equal to the second reference voltage Vref2.

In one embodiment, the control unit 27 is capable to adjust the value of the first current I1 inputted the first gm stage unit 211 and the value of the second current I2 inputted the second gm stage 213 via the comparison block 25 until the first voltage V1 generated by the first gm stage unit 211 and/or the second detecting unit 233 is equal to the first reference voltage Vref1 generated by the second gm stage unit 213 and/or the first detecting unit 231, and the second voltage V2 generated by the second gm stage unit 213 and/or the second detecting unit 233 is equal to the second reference voltage Vref2 generated by the first gm stage unit 211 and/or the first detecting unit 231.

Moreover, the control unit 27 generates a compensation signal Sc according to current signal of the comparison block 25. For example, as the first voltage V1 is equal to the first reference voltage Vref1, the value of the current signal of the comparison block 25 is equal to a first current signal Is1, and as the second voltage V2 is equal to the second reference voltage Vref2, the value of the current signal of the comparison block 25 is equal to a second current signal Is2. The control unit 27 generates the compensation signal Sc according to the first current signal Is1 and the second current signal Is2.

The compensator 29 connects with the control unit 27 to receive the compensation signal Sc form the control unit 27, and connects with the first gm stage unit 211 and the second gm stage unit 213 to adjust the first gm stage unit 211 and the second gm stage unit 213 according to the compensation signal Sc. In one embodiment, the compensator 29 provides a first bias voltage Vbias1 to the first gm stage unit 211 and provides a second bias voltage Vbias2 to the second gm stage unit 213. Moreover, the compensator 29 adjusts the value of the first bias voltage Vbias1 provided to the first gm stage unit 211 and the value of the second bias voltage Vbias2 provided to the second gm stage 213 according to the compensation signal Sc.

During actual application, please referring to FIG. 2, the first switch unit 221 is switched to connect the second gm stage unit 213 and the first detecting unit 231 and the comparison block 25, and the second switch unit 223 is switched to connect the first gm stage unit 211, the second detecting unit 233 and the comparison block 25. Thus, the comparison block 25 is able to receive the first voltage V1 from the first gm stage unit 211 and/or the second detecting unit 233, and compare the first voltage V1 and the first reference voltage Vref1 from the second gm stage unit 213 and the first detecting unit 231. Thereafter, the control unit 27 adjusts the current signal Is of the comparison block 25 until the first voltage V1 is equal to the first reference voltage Vref1.

Please referring to FIG. 3, the first switch unit 221 is switched to connect the first gm stage unit 211, the first detecting unit 231 and the comparison block 25, and the second switch unit 223 is switched to connect the second gm stage unit 213, the second detecting unit 233, and the comparison block 25. Thus, the comparison block 25 is able to receive the second voltage V2 from the second gm stage unit 213 and/or the second detecting unit 233, and compare the second voltage V2 and the second reference voltage Vref2 from the first gm stage unit 211 and the first detecting unit 231. Thereafter, the control unit 27 adjusts the current signal Is of the comparison block 25 until the second voltage V2 is equal to the second reference voltage Vref2.

In one embodiment, the control unit 27 adjusts the value of the first current I1 inputted the first gm stage 211 and the value of the second current I2 inputted the second gm stage 213 by adjusting the current signal Is of the comparison block 25.

Figure 4:
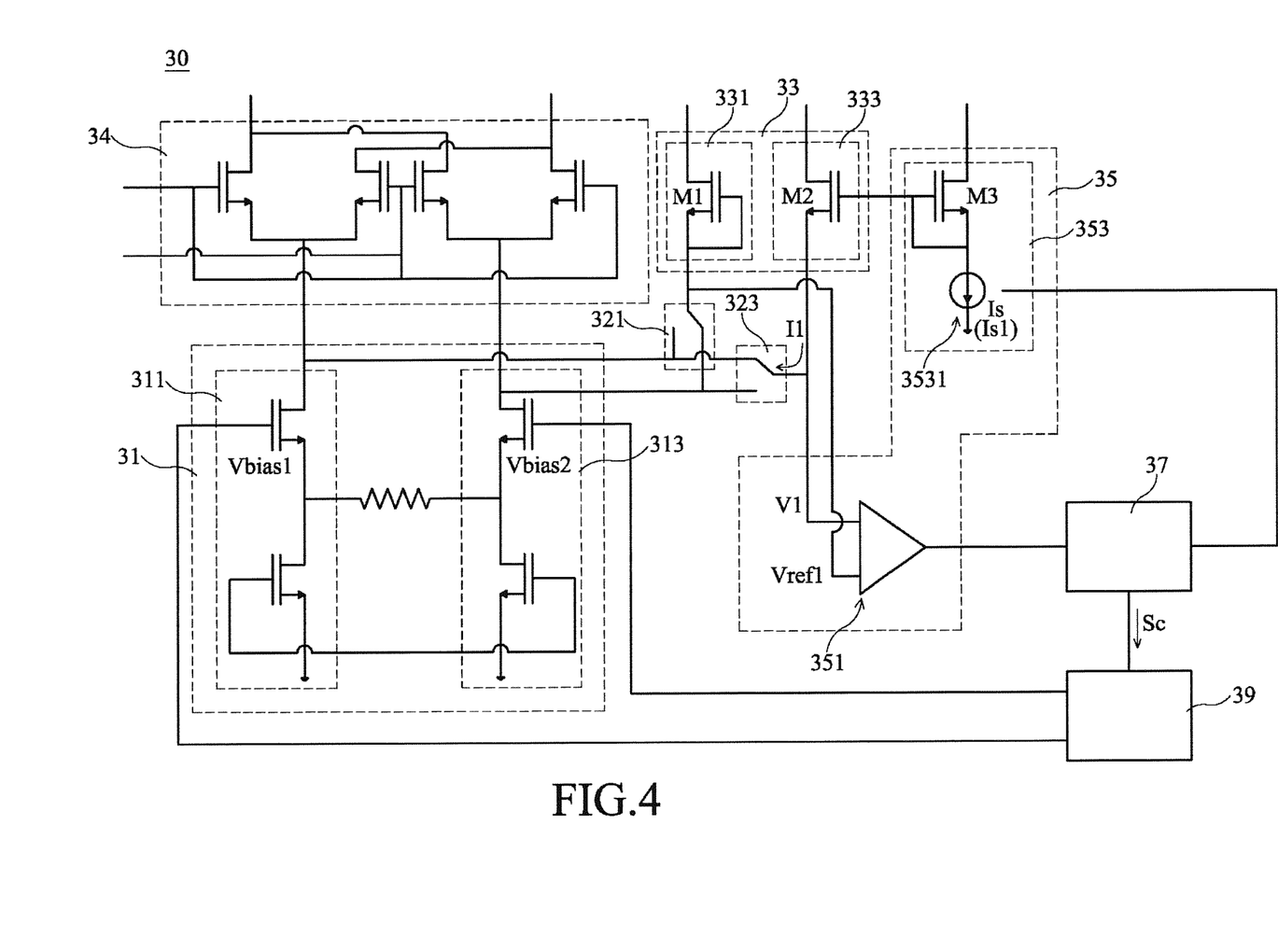
FIG. 4 is a circuit diagram of a mixer with calibration circuit in accordance with another embodiment of the present invention.

Please refer to FIG. 4, a circuit diagram of a mixer with calibration circuit in accordance with an embodiment of the present invention is shown. As illustrated, the mixer 30 comprises a gm stage block 31, a detector 33, a comparison block 35, a control unit 37, and a compensator 39, wherein the gm stage block 31 comprises a first gm stage unit 311 and a second gm stage unit 313, and the detector 33 comprises a first detecting unit 331 and a second detecting unit 333.

In one embodiment, the first gm stage unit 311 and the second gm stage unit 313 comprise a MOSFET or a plurality of MOSFETs in series. The first detecting unit 331 and the second detecting unit 333 are current-to-voltage (I-V) conversion units for converting a current form the first gm stage unit 311 or the second gm stage unit 313 into a voltage. Thus, the comparison block 35 is able to receive the voltage, such as V1, V2, Vref1 or Vref2 from the first gm stage unit 311 or the second gm stage unit 313.

The comparison block 35 and/or the first detecting unit 331 connects to the first gm stage unit 311 or the second gm stage unit 313 via a first switch unit 321, and the first switch unit 321 is adapted to switch the first gm stage unit 311 or the second gm stage unit 313, enabling the first gm stage unit 311 or the second gm stage unit 313 to be electrically connected to the comparison block 35 and/or the first detecting unit 331.

Further, the comparison block 35 and/or the second detecting unit 333 connects to the first gm stage unit 311 or the second gm stage unit 313 via a second switch unit 323, and the second switch unit 323 is adapted to switch the first gm stage unit 311 or the second gm stage unit 313, enabling the first gm stage unit 311 or the second gm stage unit 313 to be electrically connected to the comparison block 35 and/or the second detecting unit 333.

In one embodiment, the comparison block 35 comprises a comparator 351 and a current controller 353. The comparator 351 connects to the first detecting unit 331, the second detecting unit 333, the first gm stage unit 311 and/or the second gm stage unit 313, and the current controller 353 connects to detector 33 and the control unit 37. For example, the comparator 351 connects with the first detecting unit 331 and the second detecting 333, and connects to the first gm stage unit 311 or the second gm stage 313 via the first switch unit 321 or the second switch unit 323, enabling the first gm stage unit 311 or the second gm stage unit 313 to be electrically connected to the comparator 351, and the current controller 353 connects to the second detecting unit 333 and the control unit 37.

In one embodiment, the first detecting unit 331 and the second detecting unit 333 both comprise at least one MOSFET, and the current controller 353 comprises at least one MOSFET and a current source. For example, the first detecting unit 331 is a first transistor M1, and the source and gate of the MOSFET M1 are connected to each other. The second detecting unit 333 is a second transistor M2, and the current controller 353 comprises a third transistor M3 and a current control unit 3531. The second transistor M2 of the second detecting unit 333 and the third transistor M3 of the current controller 353 are connected to each other to form a current mirror. Thus, the control unit 37 is capable to adjust the current signal Is of the current control unit 3531 within the comparator 351 to adjust the value of the first current I1 and the value of the second current I2.

During calibration of the mixer, please referring to FIG. 4, the second switch unit 323 is switched to connect the first gm stage unit 311, the second detecting unit 333 and the comparator 351 to receive the first voltage V1, and the first switch unit 321 is switched to connect the second gm stage unit 313, the first detecting unit 331 and the comparator 351 to receive the first reference voltage Vref1. Further, the comparator 351 compares the first voltage V1 and the first reference voltage Vref1, and the control unit 37 adjusts the value of the current signal Is of the current control unit 3531 within the comparator 351 to adjust the value of the first current I1 inputted the first gm stage unit 311 and first voltage V1 until the first voltage V1 is equal to the first reference voltage Vref1. As the first voltage V1 is equal to the first reference voltage Vref1, the value of the current signal is of the comparison block 25 is equal to a first current signal Is1.

Figure 5:
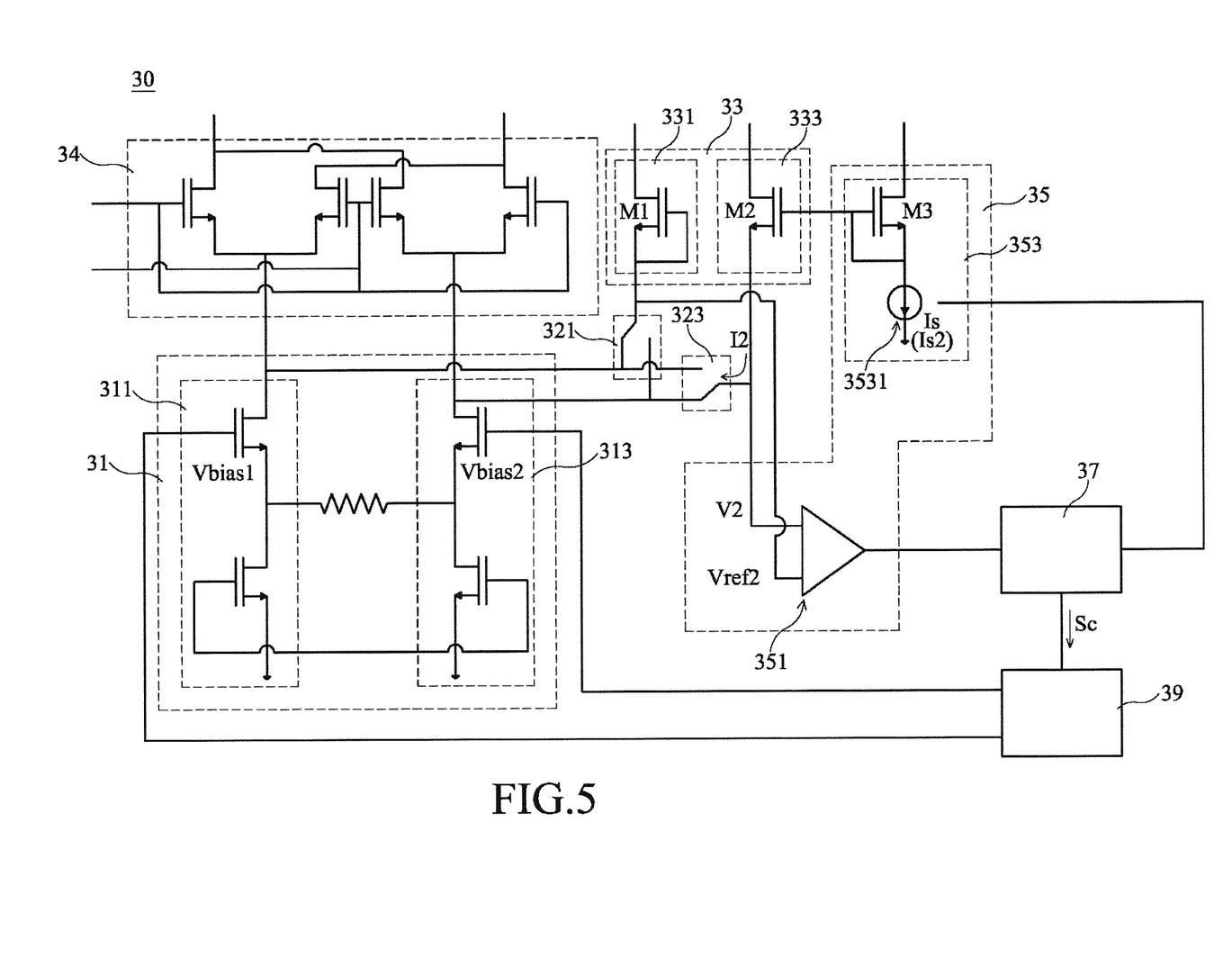

Moreover, please referring to FIG. 5, the second switch unit 323 is switched to connect the second gm stage unit 313, the second detecting unit 333 and the comparator 351 to receive the second voltage V2, and the first switch unit 321 is switched to connect the first gm stage unit 311, the first detecting unit 331 and the comparator 351 to receive the second reference voltage Vref2. Further, the comparator 351 compares the second voltage V2 and the second reference voltage Vref2, and the control unit 37 adjusts the value of the current signal Is of the current control unit 3531 within the comparator 351 to adjust the value of the second current I2 inputted the second gm stage unit 313 and second voltage V2 until the second voltage V2 is equal to the second reference voltage Vref2. As the second voltage V2 is equal to the second reference voltage Vref2, the value of the current signal Is of the comparison block 25 is equal to a second current signal Is2.

In one embodiment, the control unit 37 connects to the current controller 353, the comparator 351, and the compensator 39. The control unit 37 is capable to record the value of the first current signal Is1, as the first voltage V1 is equal to the first reference voltage Vref1, and record the value of the second current signal Is2, as the second voltage V2 is equal to the second reference voltage Vref2. Further, the control unit 37 is able to generate a compensation signal Sc to the compensator 39 according to the value of the first current signal Is1 and the value of the second current signal Is2. For example, the control unit 37 is able to compare the value of the first current signal Is1 and the second current signal Is2 to generate the compensation signal Sc.

The compensator 39 connects to the first gm stage unit 311 and the second gm stage unit 313, and provides a first bias voltage Vbias1 and a second bias voltage Vbias1 to the first gm stage unit 311 and the second gm stage unit 313 respectively. Further, the compensator 39 adjusts the first bias voltage Vbias1 and the second bias voltage Vbias2 according to the compensation signal Sc. For example, the compensator 39 connects to the gate of one MOSFET of the first gm stage unit 311 and the second gm stage unit 313, and adjusts the first bias voltage Vbias1 and the second bias voltage Vbias2 provided for the gate of one MOSFET of the first gm stage unit 311 and the second gm stage unit 313 to adjust the gain of the first gm stage unit 311 and the second gm stage unit 313.

In actual application, the mixer 30 further comprises a LO switch stage block 34 to connect to the gm stage block 31. Before calibration of the mixer 30, the LO switch stage block 34 should be turn off firstly.

Figure 6A:
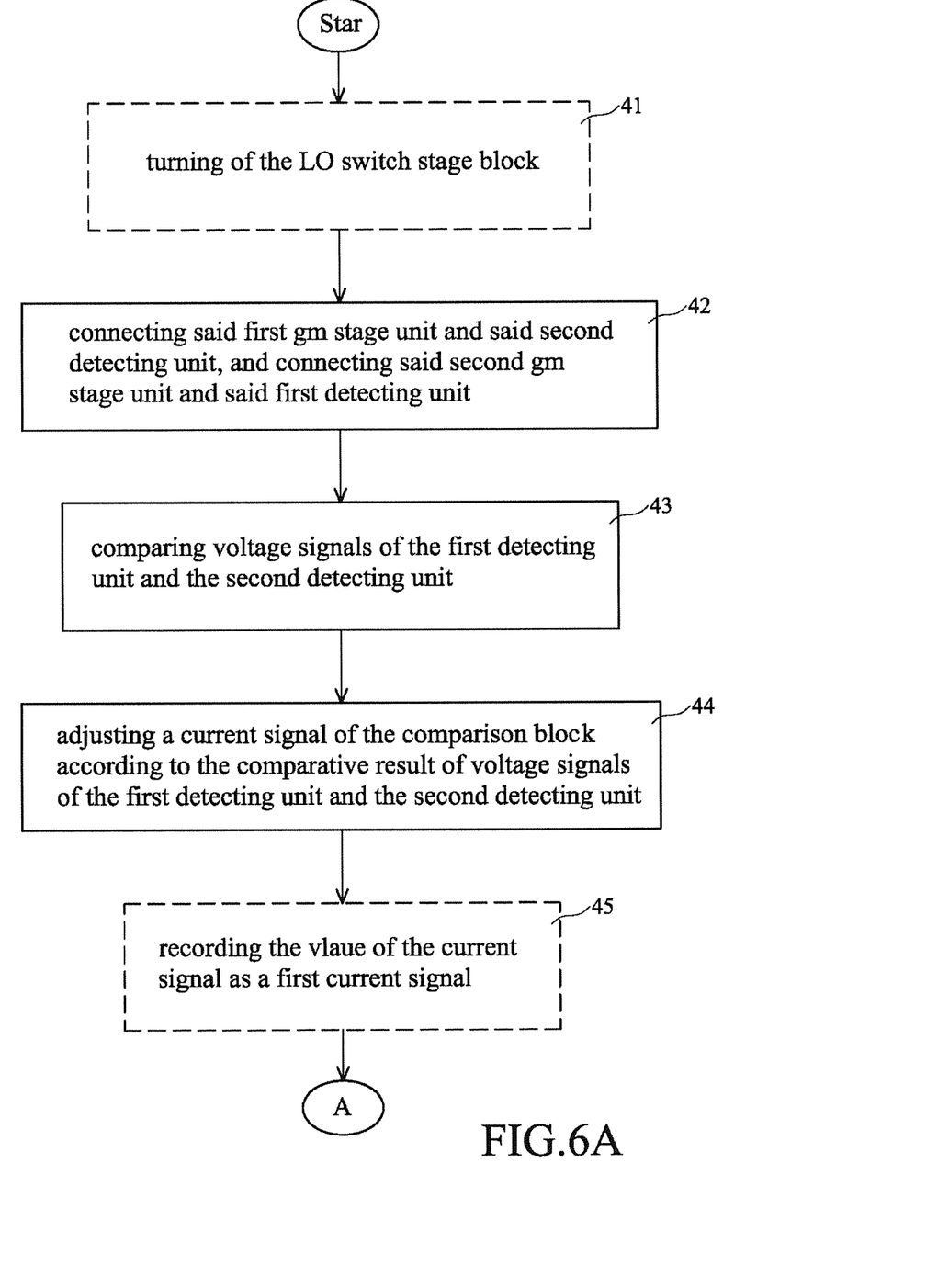
FIG. 6A and FIG. 6B are flow charts of the calibration method of a mixer in accordance with an embodiment of the present invention.
Figure 6B:
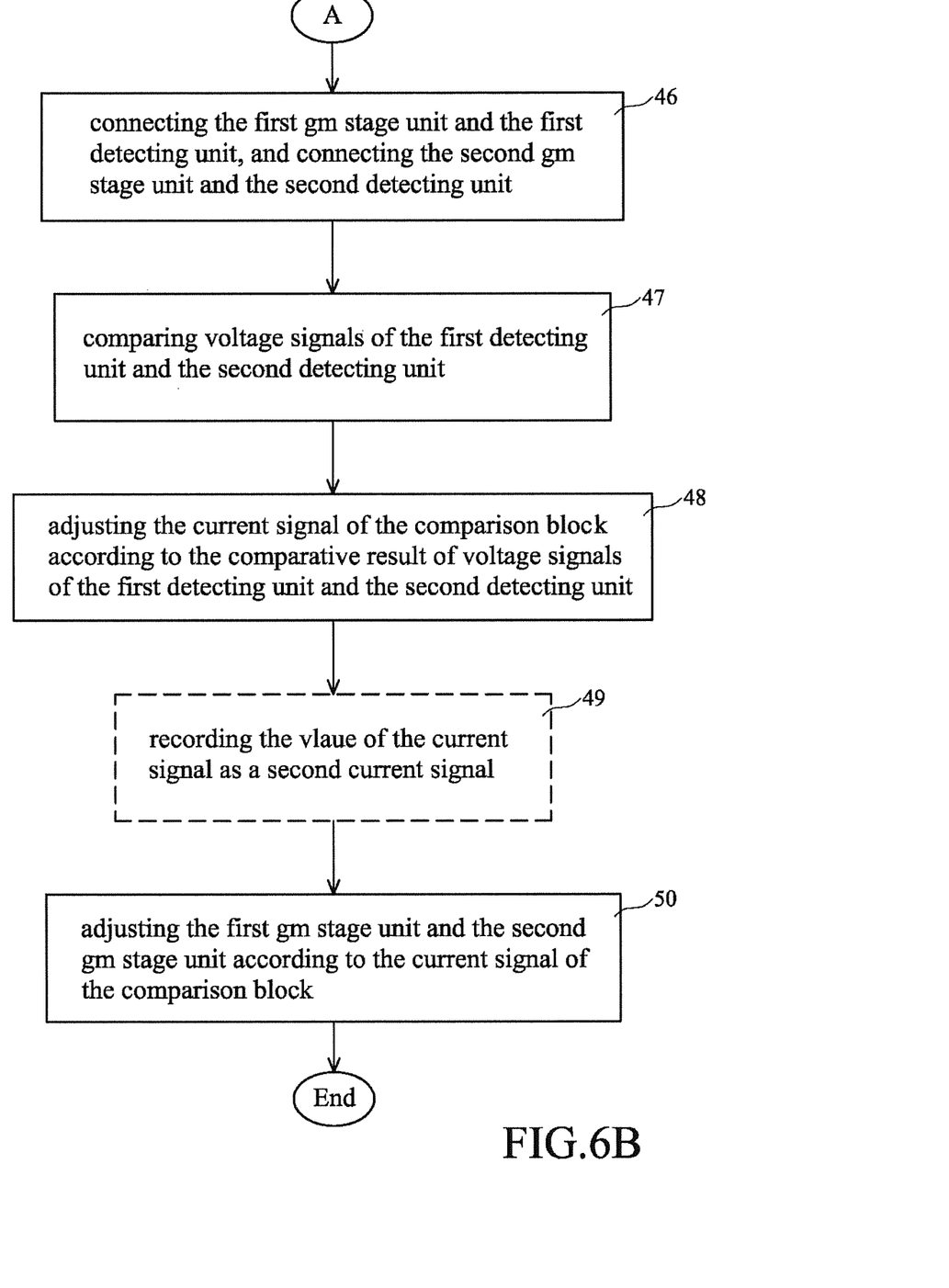

Please refer to FIG. 6A and FIG. 6B, flow charts of the calibration method of a mixer in accordance with an embodiment of the present invention are shown. As illustrated and please referring to FIG. 4 and FIG. 5, the mixer 30 comprises a gm stage block 31, a detector 33, a LO switch stage block 34, a comparison block 35, a control unit 37, and a compensator 39, wherein the gm stage block 31 comprises a first gm stage unit 311 and a second gm stage unit 313, and the detector 33 comprises a first detecting unit 331 and a second detecting unit 333.

Before calibration of the mixer 30, the LO switch stage block 34 should be turn off, as the step 41. The first gm stage unit 311 connects to the second detecting unit 333 and/or the comparison block 35, and the second gm stage unit 313 connects to the first detecting unit 331 and/or the comparison block 35, as the step 42. During actual operation, a second switch unit 323 is adapted to be switched to connect the first gm stage unit 311, the second detecting unit 333 and the comparison block 35, and the first switch unit 321 is switched to connect the second gm stage unit 313, the first detecting unit 331 and the comparison block 35.

The comparison block 35 compares voltage signals of the first detecting unit 331 and the second detecting unit 333. In one embodiment, the comparison block 35 receives a first reference voltage Vref1 from the second gm stage unit 313 and/or the first detecting unit 331, and receives a first voltage V1 from the first gm stage unit 311 and/or the second detecting unit 333. Further, the comparison block 35 compares the first voltage V1 and the first reference voltage Vref1, and then the control unit 37 adjusts the current signal Is of the comparison block 35, as the step 43.

The control unit 37 adjusts the current signal Is of the comparison block 35 according to the comparative result of voltage signals of the first detecting unit 331 and the second detecting unit 333. Moreover, the comparison block 35 and/or the second detecting unit 333 adjust the first current I1 inputted the first gm stage unit 311 and the value of the first voltage V1 until the first voltage V1 inputted the first fm stage unit 311 is equal to the first reference voltage Vref1, as the step 44.

As the first voltage V1 is equal to the first reference voltage Vref1, the value of the current signal Is of the comparison block 35 is equal to a first current signal Is1. The control unit 37 is able to record the value of the first current signal Is1, as the step 45. In one embodiment, the comparator 351 connects to the current controller 353 via the control unit 37, and the control unit 37 adjusts the value of the current signal Is of the current controller 353 within the comparison block 35 according to comparative results of the first voltage V1 and the first reference voltage Vref1.

The second gm stage unit 313 connects to the second detecting unit 333 and/or the comparison block 35, and the first gm stage unit 311 connects to the first detecting unit 331 and/or the comparison block 35, as the step 46. During actual operation, a second switch unit 323 is adapted to be switched to connect the second gm stage unit 313, the second detecting unit 333 and the comparison block 35, and the first switch unit 321 is switched to connect the first gm stage unit 311, the first detecting unit 331 and the comparison block 35.

The comparison block 35 compares voltage signals of the first detecting unit 331 and the second detecting unit 333. In one embodiment, the comparison block 35 receives a second reference voltage Vref2 from the first gm stage unit 311 and/or the first detecting unit 331, and receives a second voltage V2 from the second gm stage unit 313 and/or the second detecting unit 333. Further, the comparison block 35 compares the second voltage V2 and the second reference voltage Vref2, and then the control unit 37 adjusts the current signal Is of the comparison block 35, as the step 47.

The control unit 37 adjusts the current signal Is of the comparison block 35 according to the comparative result of voltage signals of the first detecting unit 331 and the second detecting unit 333. Thereafter, the comparison block 35 and/or the second detecting unit 333 adjust the second current I2 inputted the second gm stage unit 313 and the value of the second voltage V2 until the second voltage V2 inputted the second gm stage unit 313 is equal to the second reference voltage Vref2, as the step 48.

As the second voltage V2 is equal to the second reference voltage Vref2, the value of the current signal Is of the comparison block 35 is equal to a second current signal Is2. The control unit 37 is able to records the value of the second current signal Is2, as the step 49. In one embodiment, the control unit 37 adjusts the value of the current signal Is of the current controller 353 within the comparison block 35 according to comparative results of the second voltage V2 and the second reference voltage Vref2.

Thereafter, the compensator 39 adjusts the first gm stage unit 311 and the second gm stage 313 unit according to the current signal Is of said comparison block 35, as the step 50.

The control unit 37 connects to the comparison block 35, and is capable to adjust the current signal Is of the current control unit 3531 of the current controller 353 within the comparison block 35. Further, the control unit 37 is able to generate a compensation signal Sc according to the value of the first current signal Is1 and the second current signal Is2. For example, the control unit 37 compares the value of the first current signal Is1 and the value of the second current signal Is2 to generate the compensation signal Sc.

The compensator 39 connects with the control unit 37 to receive the compensation signal Sc form the control unit 37, and connects with the first gm stage unit 311 and the second gm stage unit 313 to provide a first bias voltage Vbias1 to the first gm stage unit 311 and provide a second bias voltage Vbias2 to the second gm stage unit 313. Moreover, the compensator 39 adjusts the value of the first bias voltage Vbias1 and the second bias voltage Vbias2 according to the compensation signal Sc. For example, the compensator 39 adjusts the value of the first bias voltage Vbias1 inputted the first gm stage unit 311 and the value of the second bias voltage Vbias2 inputted the second gm stage unit 313 according to comparative results of the first current signal Is1 and the second current signal Is2.

During actual application, the step 42, 43, 44, 45, 46, 47, 48, 49 and/or 50 may be repeated several times until the first voltage V1 is substantial equal to the second voltage V2.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A mixer with calibration circuit, comprising:
an LO switch block having an input coupled to an output of a local oscillator;
a gm stage block comprising a first gm stage unit and a second gm stage unit, wherein calibrated output currents from said first and second gm stage units are input to said LO switch block;
a detector comprising a first detecting unit configured to switchably connect between said second gm stage unit and said first gm stage unit, and a second detecting unit configured to switchably connect between said first gm stage unit and said second gm stage unit, wherein a first switch unit is connected with said first detecting unit, said first gm stage unit, and said second gm stage unit to enable either of said first gm stage unit or said second gm stage unit to connect with said first detecting unit, and a second switch unit is connected with said second detecting unit, said first gm stage unit and said second gm stage unit to enable either of said first gm stage unit or said second gm stage unit to connect with said second detecting unit;
a comparison block connected to said detector and said gm stage block adapted to compare voltage signals of said first detecting unit and said second detecting unit;
a control unit connected to said comparison block adapted to adjust a current signal of said comparison block according to the comparative result of voltage signals of said first detecting unit and said second detecting unit, and generate a compensation signal according to said current signal; and
a compensator connected with said control unit, said first gm stage unit and said second gm stage unit adapted to adjust said first gm stage unit and said second gm stage unit according to said compensation signal to provide said calibrated output current from said gm stage block.

2. The mixer as claimed in claim 1, wherein said comparison block compares a first voltage between said first gm stage unit and said second detecting unit and a first reference voltage between said second gm stage unit and said first detecting unit, and compares a second voltage between said second gm stage unit and said second detecting unit and a second reference voltage between said first gm stage unit and said first detecting unit.

3. The mixer as claimed in claim 2, wherein said control unit adjusts said current signal of said comparison block until said first voltage is equal to said first reference voltage and said second voltage is equal to said second reference voltage.

4. The mixer as claimed in claim 3, wherein said current signal is a first current signal as said first voltage is equal to said first reference voltage, and said current signal is a second current signal as said second voltage is equal to said second reference voltage.

5. The mixer as claimed in claim 4, wherein said control unit compares said first current signal and said second current signal to generate said compensation signal.

6. The mixer as claimed in claim 4, wherein said control unit records said first current signal and said second current signal.

7. The mixer as claimed in claim 1, wherein said comparison block comprises a comparator connected to said first detecting unit, said second detecting unit and said control unit, and a current controller outputted said current signal and connected to said control unit, wherein said control unit is able to adjust said current signal of said current controller.

8. The mixer as claimed in claim 1, wherein said compensator adjusts the value of a first bias voltage provided to said first gm stage unit and the value of a second bias voltage provided to said second gm stage unit according to said compensation signal.

9. The mixer as claimed in claim 1, wherein said first detecting unit and said second detecting unit are current-to-voltage conversion units.

10. The mixer as claimed in claim 9, wherein said first detecting unit comprises a first transistor and said second detecting unit comprises a second transistor, wherein the gate and the source of said first transistor are connected each other.

11. A calibration method of a mixer, wherein said mixer comprises an LO switch stage block, a first gm stage unit, a second gm stage unit, a first detecting unit, a second detecting unit, a comparison block, a control unit and a compensator, comprising steps of:
turning off said LO switch stage block;
connecting respective outputs of said first and second gm stage units to said LO switch stage block to provide calibrated current thereto;
connecting said first gm stage unit and said second detecting unit;
connecting said second gm stage unit and said first detecting unit;
comparing voltage signals of said first detecting unit and said second detecting unit;
adjusting a current signal of said comparison block according to comparative results of voltage signals of said first detecting unit and said second detecting unit;
connecting said first gm stage unit and said first detecting unit;
connecting said second gm stage unit and said second detecting unit;
comparing voltage signals of said first detecting unit and said second detecting unit;
adjusting said current signal of said comparison block according to comparative results of voltage signals of said first detecting unit and said second detecting unit; and adjusting said first gm stage unit and said second gm stage unit according to said current signal of said comparison block to provide said calibrated output current from said gm stage block.

12. The calibration method as claimed in claim 11, further comprising steps of: comparing a first voltage between said first gm stage unit and said second detecting to a first reference voltage between said second gm stage unit and said first detecting unit; and comparing a second voltage between said second gm stage unit and said second detecting to a second reference voltage between said first gm stage unit and said first detecting unit.

13. The calibration method as claimed in claim 12, wherein said current signal of said comparison block is a first current signal as said first voltage is equal to said first reference voltage, and said current signal of said comparison block is a second current signal as said second voltage is equal to said second reference voltage.

14. The calibration method as claimed in claim 13, further comprising steps of: recording the value of said first current by said control unit; and recoding the value of said second current by said control unit.

15. The calibration method as claimed in claim 13, further comprising the step of: adjusting the value of a first bias voltage inputted said first gm stage unit and the value of a second bias voltage inputted said second gm stage unit according to said first current signal and said second current signal.

16. The calibration method as claimed in claim 11, wherein said first detecting unit and said second detecting unit are current-to-voltage conversion unit.

17. The calibration method as claimed in claim 11, further comprising the step of: comparing said first current signal and said second current signal.

* * * * *